(12) United States Patent
Lin et al.

(10) Patent No.: US 11,122,699 B2
(45) Date of Patent: Sep. 14, 2021

(54) INPUT CONNECTION DEVICE

(71) Applicant: Delta Electronics, Inc., Taoyuan (TW)

(72) Inventors: Sheng-Kuo Lin, Taoyuan (TW);
Chia-Hao Yeh, Taoyuan (TW);
Xin-Hung Lin, Taoyuan (TW)

(73) Assignee: DELTA ELECTRONICS, INC.,
Taoyuan (TW)

( * ) Notice: Subject to any disclaimer, the term of this patent is extended or adjusted under 35 U.S.C. 154(b) by 81 days.

(21) Appl. No.: 16/560,483

(22) Filed: Sep. 4, 2019

(65) Prior Publication Data

US 2020/0352039 A1 Nov. 5, 2020

Related U.S. Application Data

(60) Provisional application No. 62/842,632, filed on May 3, 2019.

(30) Foreign Application Priority Data

Jul. 9, 2019 (CN) .......................... 201910616740.0

(51) Int. Cl.
*H05K 5/00* (2006.01)
*H05K 9/00* (2006.01)

(52) U.S. Cl.
CPC ......... *H05K 5/0069* (2013.01); *H05K 9/0022* (2013.01)

(58) Field of Classification Search
CPC ............................ H05K 5/0069; H05K 9/0022
See application file for complete search history.

(56) References Cited

U.S. PATENT DOCUMENTS 5,655,092 A * 8/1997 Ojala .................. G06F 13/4072
710/300
2001/0012728 A1* 8/2001 Murasawa ......... H01R 13/7197
439/607.01

(Continued)

FOREIGN PATENT DOCUMENTS

CN 2366735 Y 3/2000
CN 1365527 A 8/2002

(Continued)

OTHER PUBLICATIONS

STIC search report (dated Jan. 2021).*

*Primary Examiner* — Hung S. Bui
*Assistant Examiner* — Sagar Shrestha
(74) *Attorney, Agent, or Firm* — Kirton McConkie; Evan R. Witt

(57) ABSTRACT

An input connection device for an electronic device is provided. The electronic device includes a mother circuit board and a cabinet having a first wall. The input connection device comprises an insulation housing, a conductive connection unit, a circuit board, a switch, a first power wire and a second power wire. The insulation housing is disposed on the first wall and comprises a main body comprising a hollow channel. The conductive connection unit is disposed in the hollow channel and is engaged with the insulation housing. The circuit board is connected with the conductive connection unit directly. The switch has an input part and an output part. The first power wire is connected with the circuit board and the input part of the switch. The second power wire is connected with the output part of the switch and the mother circuit board.

18 Claims, 6 Drawing Sheets

(56) References Cited

U.S. PATENT DOCUMENTS

| | | | |
|---|---|---|---|
| 2005/0026506 A1* | 2/2005 | Kha | H01R 13/514 |
| | | | 439/638 |
| 2011/0230076 A1* | 9/2011 | Lim | H01R 13/6585 |
| | | | 439/345 |
| 2014/0025980 A1* | 1/2014 | Liang | G06F 1/3287 |
| | | | 713/324 |
| 2015/0282291 A1* | 10/2015 | Singh | H05K 1/021 |
| | | | 361/689 |
| 2016/0329658 A1* | 11/2016 | Wilcox | H05K 1/11 |
| 2018/0206359 A1* | 7/2018 | McPherson | H02M 3/158 |
| 2019/0027851 A1* | 1/2019 | Leigh | H01R 12/727 |
| 2019/0157819 A1* | 5/2019 | Hieda | H01R 27/02 |
| 2019/0172644 A1* | 6/2019 | Shen | H01R 31/065 |

FOREIGN PATENT DOCUMENTS

| | | |
|---|---|---|
| DE | 29806869 U1 | 6/1998 |
| JP | S58175683 U | 11/1983 |
| JP | S61126784 A | 6/1986 |
| JP | H0711769 U | 2/1995 |
| JP | 2012029403 A | 2/2012 |

* cited by examiner

INPUT CONNECTION DEVICE

CROSS-REFERENCE TO RELATED APPLICATION

This application claims the benefit of U.S. Provisional Application No. 62/842,632 filed on May 3, 2019, and entitled "INPUT CONNECTION DEVICE", the entirety of which is hereby incorporated by reference. This application also claims the priority to China Patent Application No. 201910616740.0 filed on Jul. 9, 2019, and entitled "INPUT CONNECTION DEVICE", the entirety of which is hereby incorporated by reference.

FIELD OF THE INVENTION

The present disclosure relates to a connection device, and more particularly to an input connection device applied to an electronic device for reducing the cost and the volume and improving the electromagnetic interference thereof.

BACKGROUND OF THE INVENTION

Nowadays, input connection device has been widely applied to a variety of electronic devices or equipment for conveying electric power or transmitting signal information from an external source to the electronic device. With increasing development of science and technology, the general trends in designing electronic devices are toward minimization, high integration and low cost. The structure design and the practical demand of the input connection device are more difficult. Therefore, it is important to develop an input connection device with miniaturized size and low cost.

Generally, the input connection device includes a plurality of electric connectors, a plurality of first power wires, a printed circuit board, a second power wire and a switch. Each electric connector is mounted on a sidewall of a cabinet of the electronic device. One end of each first power wire is connected with the corresponding electric connector, and the other end of each first power wire is connected with the printed circuit board, which is disposed in the cabinet. One end of the second power wire is connected with the printed circuit board, and the other end of the second power wire is connected with the switch. Therefore, when the electric connector receives electric power or signal information from an external source, the electric power or the signal information is transmitted from the electric connector to the switch through the first power wire, the printed circuit board and the second power wire.

However, if the number of the electric connectors is increased, the number of the first power wires is increased accordingly. Consequently, the cost and the volume of the input connection device are increased. Moreover, assembly method of the input connection device is complicated and wire organization is difficult because of the plurality of first power wires, and incorrect connections between the first power wires and the electric connectors may occur easily. Furthermore, the first power wire generates additional electromagnetic interference on the input connection device, which may degrade the performance of the electronic device.

Therefore, there is a need of providing an input connection device so as to overcome the drawbacks of the conventional technologies.

SUMMARY OF THE INVENTION

An object of the present disclosure provides an input connection device applied to an electronic device for reducing the cost and the volume and improving the electromagnetic interference thereof.

In accordance with an aspect of the present disclosure, an input connection device for an electronic device is provided. The electronic device includes a mother circuit board and a cabinet having a first wall. The input connection device comprises an insulation housing, a conductive connection unit, a circuit board, a switch, at least one first power wire and at least one second power wire. The insulation housing is disposed on the first wall and comprises a main body comprising a hollow channel. The conductive connection unit is disposed in the hollow channel and is engaged with the insulation housing. The circuit board is connected with the conductive connection unit directly. The switch has an input part and an output part. One end of the first power wire is connected with the circuit board. The other end of the first power wire is connected with the input part of the switch. One end of the second power wire is connected with the output part of the switch. The other end of the second power wire is connected with the mother circuit board.

In accordance with an aspect of the present disclosure, an input connection device for an electronic device is provided. The electronic device includes a mother circuit board and a cabinet having a first wall. The input connection device comprises a plurality of insulation housings, a plurality of conductive connection units, at least one circuit board, a switch, a plurality of first power wires and a plurality of second power wires. Each of the insulation housing is disposed on the first wall and comprises a main body comprising a hollow channel. Each of the conductive connection unit is disposed in the hollow channel of the corresponding insulation housing and is engaged with the corresponding insulation housing. The at least one circuit board is connected with the plurality of conductive connection units directly. The switch has an input part and an output part. One end of each first power wire is connected with the circuit board. The other end of each first power wire is connected with the input part of the switch. One end of each second power wire is connected with the output part of the switch. The other end of each second power wire is connected with the mother circuit board.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
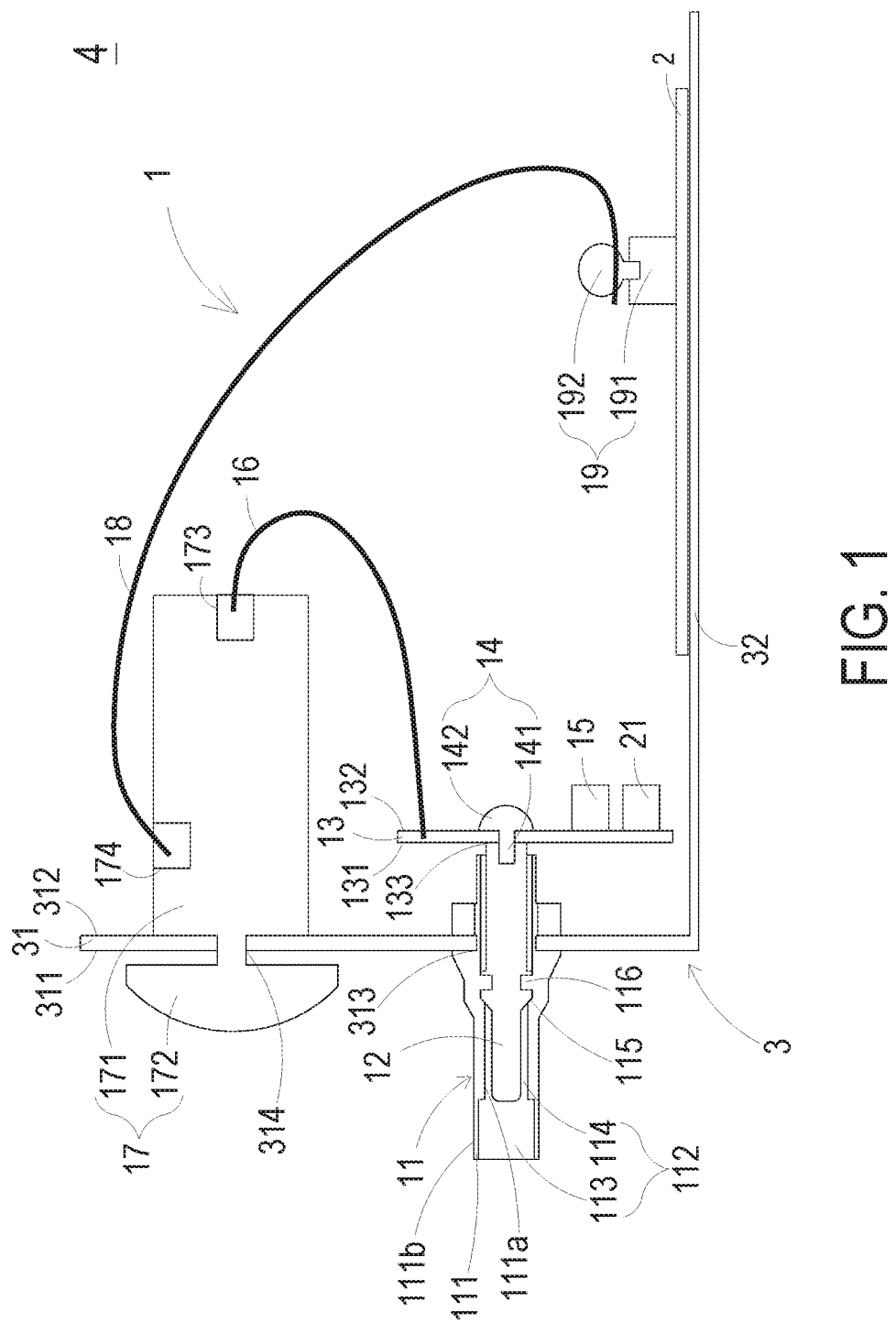
FIG. 1 is a schematic perspective view illustrating an input connection device according to a first embodiment of the present disclosure.
Figure 2:
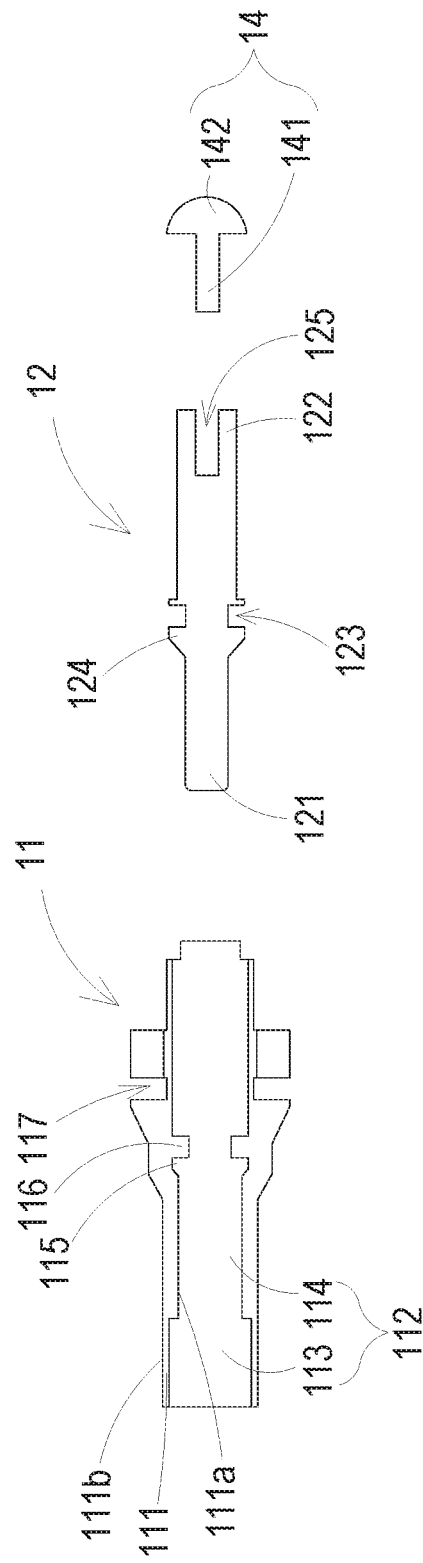
FIG. 2 is a schematic exploded view illustrating an insulation housing, a conductive connection unit and a fastening element of the input connection device of FIG. 1.

FIG. 1 is a schematic perspective view illustrating an input connection device according to a first embodiment of the present disclosure. FIG. 2 is a schematic exploded view illustrating an insulation housing, a conductive connection unit and a fastening element of the input connection device of FIG. 1. As shown in FIGS. 1 and 2, the input connection device 1 is applied to an electronic device 4 for receiving electric power or signal information from an external source, for example a DC power source, and conveying the electric power or transmitting the signal information to an internal device of the electronic device 4. The electronic device 4 includes the input connection device 1, a mother circuit board 2 and a cabinet 3. The cabinet 3 has a first wall 31 and a second wall 32 connected to the first wall 31. The first wall 31 has an outer side 311 and an inner side 312. The mother circuit board 2 is disposed in the cabinet 3. The input connection device 1 is disposed in the cabinet 3 and electrically connected with the mother circuit board 2. The input connection device 1 includes an insulation housing 11, a conductive connection unit 12, a circuit board 13, a fastening element 14, at least one electronic component 15, at least one first power wire 16, a switch 17, a second power wire 18 and a first connection element 19.

In this embodiment, the insulation housing 11 includes a main body 111 having a hollow channel 112. The hollow channel 112 runs through two ends of the main body 111 so as to form two openings at two ends. The hollow channel 112 includes a first channel section 113 and a second channel section 114. The main body 111 includes an inner surface 111a, an outer surface 111b, at least one first groove 115, at least one first protrusion 116 and at least one engaging element 117. The first channel section 113 has an aperture greater than that of the second channel section 114 and is served as a first accommodation space for receiving a matching electric connector (not shown). The at least one first groove 115 is formed on the inner surface 111a of the main body 111 and located at the second channel section 114. The at least one first protrusion 116 is formed on the inner surface 111a of the main body 111, adjacent to the first groove 115 and located at the second channel section 114. The at least one engaging element 117 is formed on the outer surface 111b of the main body 111. The insulation housing 11 is penetrated through and fitted in a first hole 313 of the first wall 31 of the cabinet 3. The at least one engaging element 117 of the insulation housing 11 is engaged with the edge of the first hole 313 of the first wall 31, so that the insulation housing 11 is fixed on the first wall 31 and portion of the insulation housing 11 is exposed from the outer side 311 of the first wall 31.

In this embodiment, at least portion of the conductive connection unit 12 is disposed in the hollow channel 112 of the main body 111 of the insulation housing 11. Preferably but not exclusively, portion of the conductive connection unit 12 is disposed in the second channel section 114 of the hollow channel 112. The conductive connection unit 12 includes a first end 121, a second end 122, at least one second groove 123, at least one second protrusion 124 and a second accommodation space 125. The at least one second groove 123 is formed on the periphery of the conductive connection unit 12 and is corresponding to the at least one first protrusion 116 of the main body 111. The at least one second protrusion 124 is formed on the periphery of the conductive connection unit 12 and is corresponding to the at least one first groove 115 of the main body 111. When at least portion of the conductive connection unit 12 is disposed in the hollow channel 112 of the main body 111 of the insulation housing 11, the second groove 123 of the conductive connection unit 12 is engaged with the first protrusion 116 of the main body 111 and the second protrusion 124 of the conductive connection unit 12 is engaged with the first groove 115 of the main body 111, so that the conductive connection unit 12 is securely fixed in the insulation housing 11. The first end 121 and the second end 122 of the conductive connection unit 12 are opposite to each other. The first end 121 of the conductive connection unit 12 is used to contact with a contact part of the matching electric connector (not shown) and is configured to receive the electric power or the signal information transmitted from the electric connector. In some embodiments, the first end 121 of the conductive connection unit 12 is a female connector, and the contact part of the matching electric connector is a male connector, which matches with the female connector. Alternatively, the first end 121 of the conductive connection unit 12 is a male connector, and the contact part of the matching electric connector is a female connector, which matches with the male connector. The second end 122 of the conductive connection unit 12 is exposed from the inner side 312 of the first wall 31. The conductive connection unit 12 outputs the electric power or the signal information through the second end 122 of the conductive connection unit 12. The second accommodation space 125 is formed at the second end 122 of the conductive connection unit 12. In some embodiments, the insulation housing 11 and the conductive connection unit 12 are formed into one piece. The conductive connection unit 12 is made of metal material.

In this embodiment, the circuit board 13 is disposed on the second end 122 of the conductive connection unit 12 and electrically connected with the second end 122 of the conductive connection unit 12 directly. Preferably but not exclusively, the circuit board 13 is perpendicular to the conductive connection unit 12 and the insulation housing 11. The circuit board 13 has a first side 131 and a second side 132 opposite to each other. The second end 122 of the conductive connection unit 12 is electrically connected with a contact pad (not shown) on the first side 131 of the circuit board 13. In this embodiment, the fastening element 14 is made of metal material. The fastening element 14 includes a first end 141 and a second end 142. The first end 141 of the fastening element 14 is penetrated through a hole 133 of the circuit board 13 and fitted in the second accommodation space 125 of the conductive connection unit 12. Namely, a part of the first end 141 of the fastening element 14 is disposed in the hole 133 of the circuit board 13, and the other part of the first end 141 of the fastening element 14 is engaged with the second end 122 of the conductive connection unit 12 so that the other part of the first end 141 of the fastening element 14 is fitted in the second accommodation space 125. The second end 141 of the fastening element 14 is disposed on the second side 132 of the circuit board 13.

Consequently, the circuit board 13 is fastened on the second end 122 of the conductive connection unit 12 through the fastening element 14.

In an embodiment, the conductive connection unit 12 is disposed in the hollow channel 112 of the main body 111 of the insulation housing 11 before the second end 122 of the conductive connection unit 12 is connected with the circuit board 13. In other embodiment, the conductive connection unit 12 is disposed in the hollow channel 112 of the main body 111 of the insulation housing 11 after the second end 122 of the conductive connection unit 12 is connected with the circuit board 13.

In an embodiment, a first screw thread is formed on the outer surface of the first end 141 of the fastening element 14. A second screw thread is formed on the inner surface of the second end 122 of the conductive connection unit 12. Namely, the second screw thread is formed on the surface of the second accommodation space 125. The second screw thread of the conductive connection unit 12 is engaged with the first screw thread of the fastening element 14 so that the fastening element 14 is fixed on the conductive connection unit 12. Consequently, the circuit board 13 is fastened on the second end 122 of the conductive connection unit 12 through the fastening element 14. In other embodiment, the shape of the second accommodation space 125 of the conductive connection unit 12 matches with the shape of the first end 141 of the fastening element 14 so that the first end 141 of the fastening element 14 is fixed on the second end 122 of the conductive connection unit 12.

In this embodiment, the at least one electronic component 15 is disposed on at least one of the first side 131 and the second side 132 of the circuit board 13. Preferably, the electronic component 15 is disposed on the second side 132 of the circuit board 13. The electronic component 15 is electrically connected with the second end 122 of the conductive connection unit 12 through the circuit board 13. The electronic component 15 may be an EMI suppressing element, for example but not limited to a capacitor. The electronic component 15 is used to suppress electromagnetic interference of the conductive connection unit 12.

In this embodiment, one end of the first power wire 16 is electrically connected to the second side 132 of the circuit board 13, and the other end of the first power wire 16 is electrically connected with the switch 17. Consequently, the conductive connection unit 12 is electrically connected to the switch 17 through the circuit board 13 and the first power wire 16. The switch 17 includes a first end 171, a second end 172, an input part 173 and output part 174. The input part 173 and the output part 174 are located at the first end 171. The first end 171 of the switch 17 is exposed from the inner side 312 of the first wall 31 of the cabinet 3. The input part 173 is electrically connected with the other end of the first power wire 16 for receiving the electric power or the signal information from the circuit board 13. A part of the second end 172 of the switch 17 is penetrated through a second hole 314 of the first wall 31 to connect with the first end 171 of the switch 17. The other part of the second end 172 of the switch 17 is exposed from the outer side 311 of the first wall 31 of the cabinet 3 and served as a selector, such as a button or a knob switch. The switch 17 is turned on or turned off for selectively allowing the electric power or the signal information to be transmitted from circuit board 13 to the mother circuit board 2. Namely, when the second end 172 of the switch 17 is pressed, the switch 17 is turned on for allowing the electric power or the signal information to be transmitted from circuit board 13 to the mother circuit board 2. When the second end 172 of the switch 17 is not pressed, the switch 17 is turned off for interrupting electric power or the signal information to be transmitted from circuit board 13 to the mother circuit board 2. Preferably but not exclusively, the switch 17 is a DC switch.

In this embodiment, one end of the second power wire 18 is electrically connected with the output part 174 of the switch 17, and the other end of the second power wire 18 is electrically connected with the mother circuit board 2. Consequently, the electric power or the signal information transmitted from the switch 17 is transmitted to the mother circuit board 2. In this embodiment, the first connection element 19 is connected to the other end of the second power wire 18. The first connection element 19 includes a first end 191 and a second end 192 connected with each other. The first end 191 of the first connection element 19 is connected with the mother circuit board 2, and the second end 192 of the first connection element 19 is connected with the other end of the second power wire 18, so that the second power wire 18 is electrically connected with the mother circuit board 2 through the first connection element 19. In some embodiments, the second power wire 18 is connected with the mother circuit board 2 directly and the first connection element 19 is omitted.

The mother circuit board 2 is disposed on the inner side of the second wall 32 of the cabinet 3. Preferably but not exclusively, the mother circuit board 2 is perpendicular to the circuit board 13.

In some embodiments, the input connection device 1 further includes at least one current sensor 21. The at least one current sensor 21 is disposed on at least one of the first side 131 and the second side 132 of the circuit board 13 for sensing the current flowing through the circuit board 13. Preferably, the current sensor 21 is disposed on the second side 132 of the circuit board 13.

Figure 3:
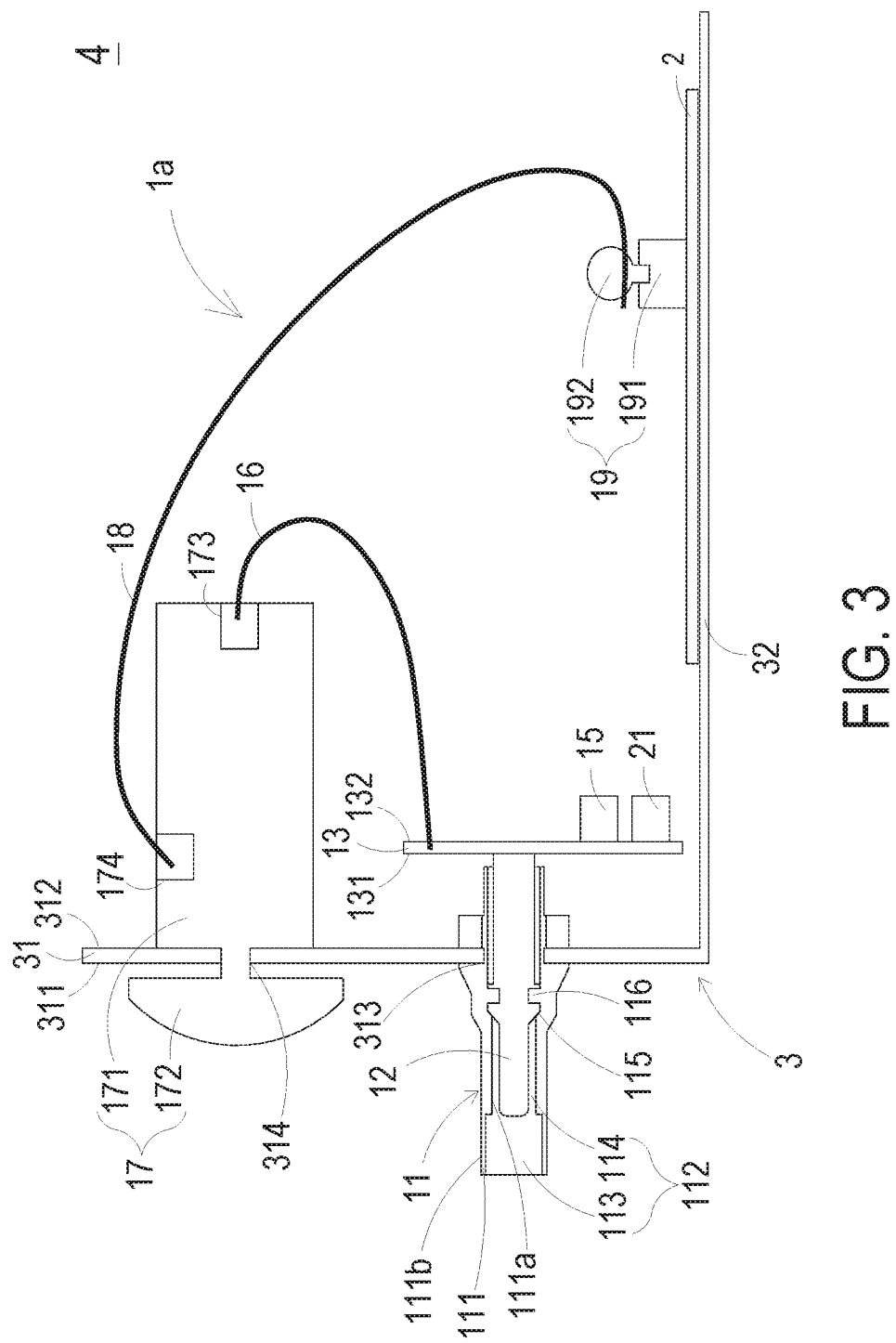
FIG. 3 is a schematic perspective view illustrating an input connection device according to a second embodiment of the present disclosure.

FIG. 3 is a schematic perspective view illustrating an input connection device according to a second embodiment of the present disclosure. The structures and functions of the input connection device 1a of this embodiment are similar to those of the first embodiment. Component parts and elements corresponding to those of the first embodiment are designated by identical numeral references, and detailed descriptions thereof are omitted. Different from the input connection device 1 of FIGS. 1 and 2, in this embodiment as shown in FIG. 3, the second end 122 of the conductive connection unit 12 is connected with the circuit board 13 directly without any fastening element, and the second accommodation space of the conductive connection unit 12 is omitted. The conductive connection unit 12 includes a first end 121 and a second end 122. The second end 122 of the conductive connection unit 12 is electrically connected with the contact pad (not shown) of the circuit board 13 directly. Preferably, the conductive connection unit 12 and the circuit board 13 are formed into one piece. When portion of the conductive connection unit 12 is disposed in the hollow channel 112 of the main body 111 of the insulation housing 11, the circuit board 13 is connected with the insulation housing 11. In some embodiments, the second end 122 of the conductive connection unit 12 is electrically connected with the circuit board 13 through a conductive glue. In some other embodiments, the second end 122 of the conductive connection unit 12 is soldered on the circuit board 13.

Figure 4:
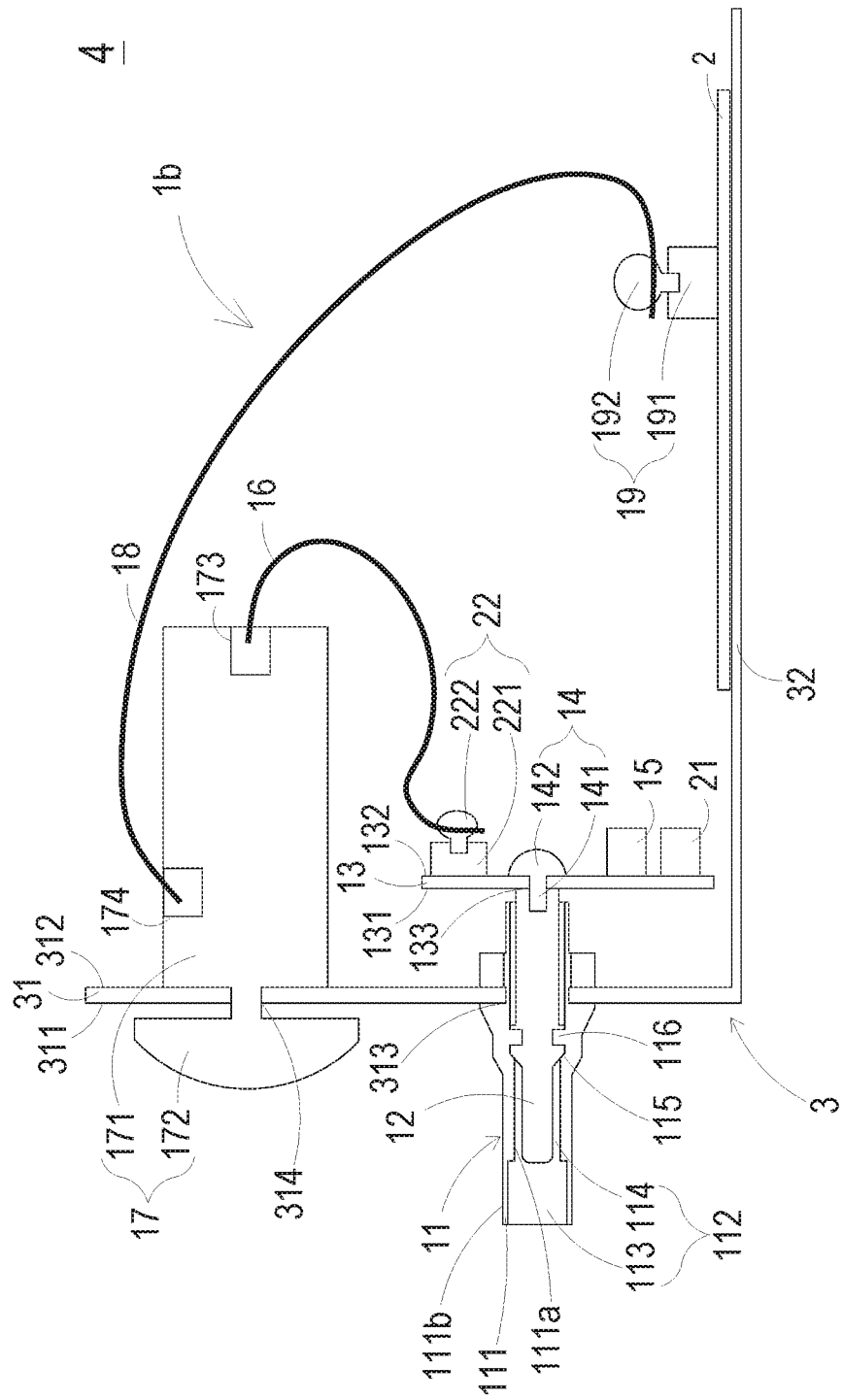
FIG. 4 is a schematic perspective view illustrating an input connection device according to a third embodiment of the present disclosure.

FIG. 4 is a schematic perspective view illustrating an input connection device according to a third embodiment of the present disclosure. The structures and functions of the input connection device 1b of this embodiment are similar to those of the first embodiment. Component parts and elements corresponding to those of the first embodiment are designated by identical numeral references, and detailed descriptions thereof are omitted. Different from the input connection device 1 of FIGS. 1 and 2, in this embodiment as shown in FIG. 4, the input connection device 1b further includes a second connection element 22 connected to the end of the first power wire 16. The second connection element 22 includes a first end 221 and a second end 222 connected with each other. The first end 221 of the second connection element 22 is connected with the circuit board 13 and disposed on the second side 132 of the circuit board 13. The second end 222 of the second connection element 22 is connected with the end of the first power wire 16, so that the first power wire 16 is connected between circuit board 13 and the switch 17 for conveying the electric power or transmitting the signal information from the circuit board 13 to the switch 17.

Figure 5:
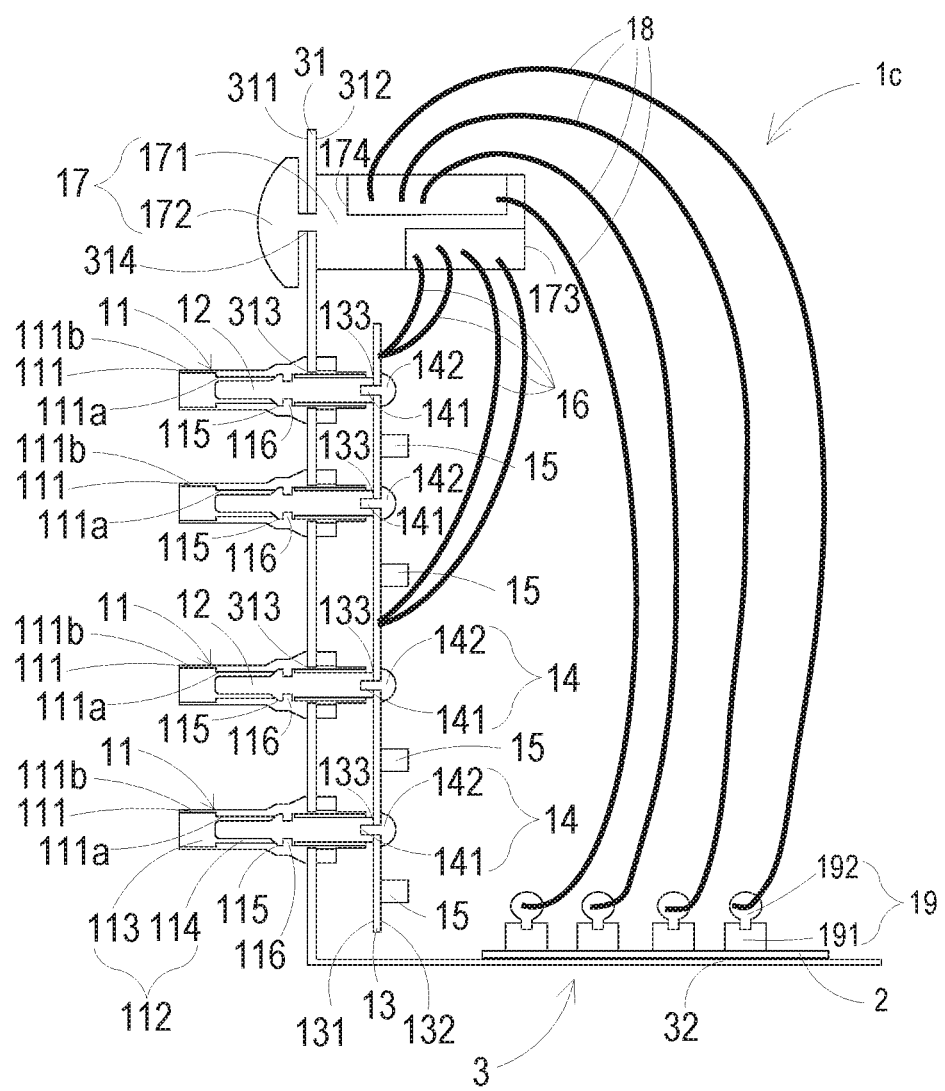
FIG. 5 is a schematic perspective view illustrating an input connection device according to a fourth embodiment of the present disclosure.

FIG. 5 is a schematic perspective view illustrating an input connection device according to a fourth embodiment of the present disclosure. The structures and functions of the input connection device 1c of this embodiment are similar to those of the first embodiment. Component parts and elements corresponding to those of the first embodiment are designated by identical numeral references, and detailed descriptions thereof are omitted. Different from the input connection device 1 of FIGS. 1 and 2, in this embodiment as shown in FIG. 5, the input connection device 1c includes a plurality of insulation housings 11, a plurality of conductive connection units 12, a circuit board 13, a plurality of fastening elements 14, a plurality of electronic components 15, a plurality of first power wires 16, a switch 17, a plurality of second power wires 18a and a plurality of first connection elements 19. The numbers of the insulation housings 11, the conductive connection units 12 and the fastening elements 14 are the same. The first side 31 of the cabinet 3 includes a plurality of first holes 313, and the circuit board 13 includes a plurality of holes 133. Each insulation housing 11 is penetrated through and fitted in the corresponding first hole 313 of the first side 31 of the cabinet 3. Each conductive connection unit 12 is disposed in the hollow channel 112 of the corresponding insulation housing 11. Each fastening element 14 is penetrated through the corresponding hole 133 of the circuit board 13 and is engaged with the second end 122 of the corresponding conductive connection unit 12. The plurality of electronic components 15 are disposed on the circuit board 13. One end of each first power wire 16 is connected with the circuit board 13, and the other end of each first power wire 16 is connected with the input part 173 of the switch 17. One end of each second power wire 18 is connected with the output part 174 of the switch 17, and the other end of each second power wire 18 is connected with the mother circuit board 2. Each first connection element 19 is connected with the other end of the corresponding second power wire 18. Each second power wire 18 is connected with the mother circuit board 2 through the corresponding first connection element 19.

Figure 6:
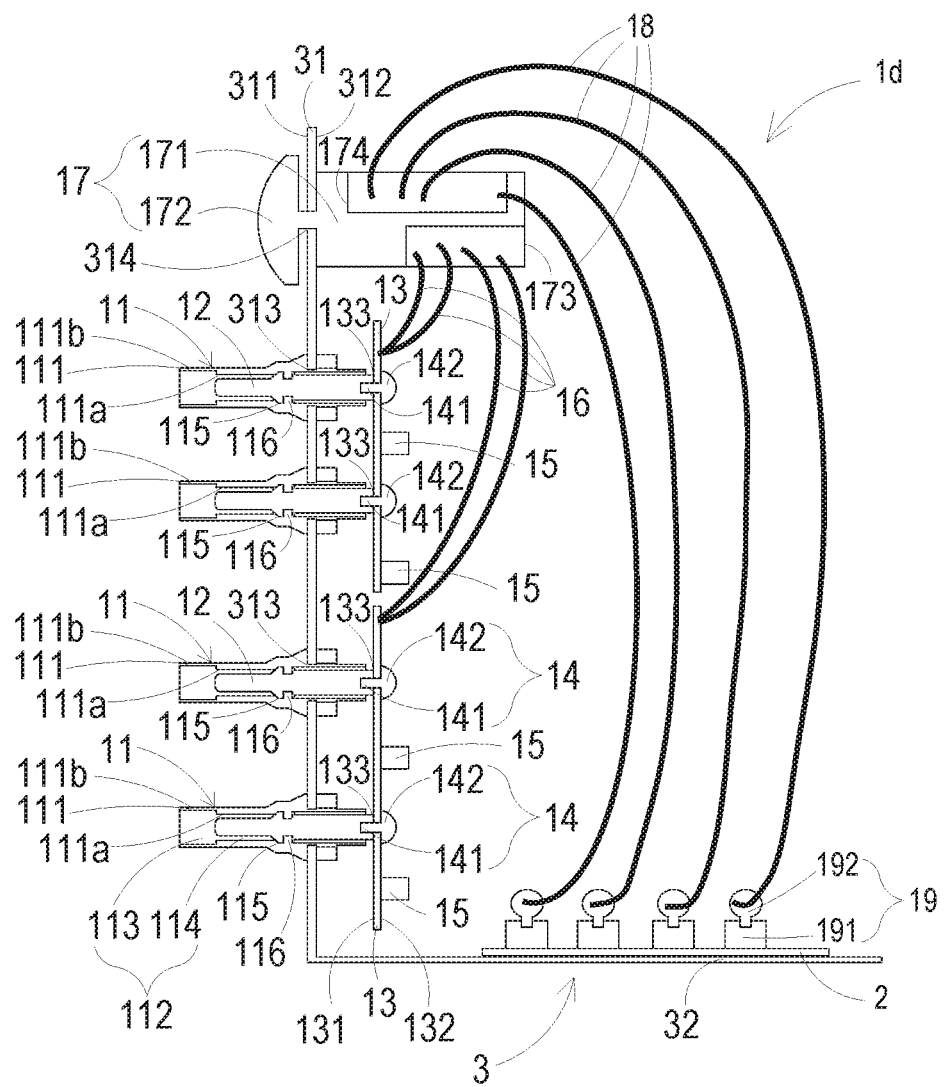
FIG. 6 is a schematic perspective view illustrating an input connection device according to a fifth embodiment of the present disclosure.

FIG. 6 is a schematic perspective view illustrating an input connection device according to a fifth embodiment of the present disclosure. The structures and functions of the input connection device 1d of this embodiment are similar to those of the fourth embodiment. Component parts and elements corresponding to those of the fourth embodiment are designated by identical numeral references, and detailed descriptions thereof are omitted. Different from the input connection device 1c of FIG. 5, in this embodiment as shown in FIG. 6, the input connection device 1d includes a plurality of circuit boards 13. Preferably but not exclusively, the input connection device 1d includes two circuit boards 13. Each circuit board 13 includes a plurality of holes 133. Portion of the plurality of the conductive connection units 12 are connected with one circuit board 13, and the residue of the plurality of the conductive connection units 12 are connected with the other circuit board 13. Portion of the plurality of the first power wires 16 are connected with one circuit board 13, and the residue of the plurality of the first power wires 16 are connected with the other circuit board 13. The structures and connections of the components of the input connection device 1d of this embodiment are similar to those of the fourth embodiment, and detailed descriptions thereof are omitted.

From the above descriptions, the present disclosure provides the input connection device applied in an electronic device. The input connection device includes a conductive connection unit and a circuit board, and the conductive connection unit is connected with the circuit board directly without any power wire. Therefore, the cost and the volume of the input connection device are reduced, the assembly method of the input connection device is simplified and the wire organization is easier. Moreover, the electromagnetic interference of the input connection device is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An input connection device for an electronic device, wherein the electronic device includes a mother circuit board and a cabinet having a first wall, the input connection device comprising:
    an insulation housing disposed on the first wall and comprising a main body comprising a hollow channel;
    a conductive connection unit disposed in the hollow channel and engaged with the insulation housing;
    a circuit board connected with the conductive connection unit directly;
    at least one fastening element, wherein a connection between a second end of the conductive connection unit and the at least one fastening element is penetrated through and connected with the circuit board;
    a switch having an input part and an output part;
    at least one first power wire, wherein one end of the at least one first power wire is connected with the circuit board, and the other end of the at least one first power wire is connected with the input part of the switch; and
    at least one second power wire, wherein one end of the at least one second power wire is connected with the output part of the switch, and the other end of the at least one second power wire is connected with the mother circuit board.

2. The input connection device according to claim 1, wherein the hollow channel runs through two ends of the main body and includes a first channel section and a second channel section, and the first channel section has an aperture greater than that of the second channel section and is served as a first accommodation space, wherein the main body further comprises:
    an inner surface;
    an outer surface;
    at least one first groove formed on the inner surface of the main body and located at the second channel section;

at least one first protrusion formed on the inner surface of the main body, adjacent to the at least one first groove and located at the second channel section; and at least one engaging element formed on the outer surface of the main body, wherein the insulation housing is penetrated through and fitted in a first hole of the first wall, and the at least one engaging element of the insulation housing is engaged with an edge of the first hole of the first wall, so that the insulation housing is fixed on the first wall and portion of the insulation housing is exposed from an outer side of the first wall.

3. The input connection device according to claim 2, wherein at least portion of the conductive connection unit is disposed in the second channel section of the hollow channel of the main body, wherein the conductive connection unit comprises:

a first end;

the second end opposite to the first end;

at least one second groove formed on a periphery of the conductive connection unit and corresponding to the at least one first protrusion of the main body;

at least one second protrusion formed on the periphery of the conductive connection unit and corresponding to the at least one first groove of the main body, wherein the at least one second groove of the conductive connection unit is engaged with the at least one first protrusion of the main body and the at least one second protrusion of the conductive connection unit is engaged with the at least one first groove of the main body, so that the conductive connection unit is securely fixed in the insulation housing and the second end of the conductive connection unit is exposed from an inner side of the first wall.

4. The input connection device according to claim 3, wherein the conductive connection unit is made of metal material.

5. The input connection device according to claim 1, wherein the conductive connection unit further comprises a second accommodation space formed at the second end thereof, wherein the fastening element comprises a first end and a second end, a part of the first end of the fastening element is disposed in a hole of the circuit board, and the other part of the first end of the fastening element is engaged with the second end of the conductive connection unit so that the other part of the first end of the fastening element is fitted in the second accommodation space and the circuit board is fastened on the second end of the conductive connection unit through the fastening element.

6. The input connection device according to claim 1, wherein the circuit board is perpendicular to the conductive connection unit and the insulation housing, wherein the circuit board has a first side and a second side opposite to each other, the conductive connection unit is electrically connected with a contact pad on the first side of the circuit board, and the end of the at least one first power wire is connected to the second side of the circuit board.

7. The input connection device according to claim 1, further comprising at least one electronic component disposed on the circuit board and electrically connected with the conductive connection unit through the circuit board, wherein the at least one electronic component is an EMI suppressing element.

8. The input connection device according to claim 1, wherein the switch includes a first end and a second end connected with each other, the first end of the switch is exposed from an inner side of the first wall, a part of the second end of the switch is penetrated through a second hole of the first wall, the other part of the second end of the switch is exposed from an outer side of the first wall and served as a selector, and the input part and the output part are located at the first end, wherein the switch is turned on or turned off for selectively allowing electric power or signal information to be transmitted from the conductive connection unit to the mother circuit board through the circuit board and the at least one first power wire.

9. The input connection device according to claim 8, wherein the switch is a DC switch.

10. The input connection device according to claim 1, further comprising a first connection element connected to the other end of the at least one second power wire, wherein the at least one second power wire is connected with the mother circuit board through the first connection element.

11. The input connection device according to claim 1, further comprising at least one current sensor disposed on the circuit board for sensing current flowing through the circuit board.

12. The input connection device according to claim 1, further comprising a second connection element connected to the end of the at least one first power wire, wherein the at least one first power wire is connected with the circuit board through the second connection element.

13. An input connection device for an electronic device, wherein the electronic device includes a mother circuit board and a cabinet having a first wall, the input connection device comprising:

a plurality of insulation housings, wherein each of which is disposed on the first wall and comprises a main body comprising a hollow channel;

a plurality of conductive connection units, wherein each of which is disposed in the hollow channel of the corresponding insulation housing and is engaged with the corresponding insulation housing;

at least one circuit board connected with the plurality of conductive connection units directly;

a switch having an input part and an output part;

a plurality of first power wires, wherein one end of each first power wire is connected with the circuit board, and the other end of each first power wire is connected with the input part of the switch; and a plurality of second power wires, wherein one end of each second power wire is connected with the output part of the switch, and the other end of each second power wire is connected with the mother circuit board.

14. The input connection device according to claim 13, wherein the at least one circuit board comprises two circuit boards.

15. The input connection device according to claim 13, further comprising a plurality of fastening elements, wherein a second end of each conductive connection unit is connected with the circuit board through the corresponding fastening element.

16. The input connection device according to claim 13, further comprising a plurality of electronic components disposed on the circuit board and electrically connected with the plurality of conductive connection units through the circuit board, wherein the electronic component is an EMI suppressing element or a current sensor.

17. The input connection device according to claim 13, wherein the switch is a DC switch.

18. The input connection device according to claim 13, wherein a second end of each conductive connection unit is connected with the circuit board through a conductive glue or a second end of each conductive connection unit is soldered on the circuit board.

\* \* \* \* \*